US005635339A

United States Patent [19]
Murray

[11] Patent Number: 5,635,339
[45] Date of Patent: Jun. 3, 1997

[54] 3-HETEROARAMATIC-SUBSTITUTED ACRYLONITRILE COMPOUNDS AS CO-DEVELOPERS FOR BLACK-AND-WHITE PHOTOTHERMOGRAPHIC AND THERMOGRAPHIC ELEMENTS

[75] Inventor: Thomas J. Murray, Woodbury, Minn.

[73] Assignee: Minnesota Mining and Manufacturing Company, St. Paul, Minn.

[21] Appl. No.: 648,742

[22] Filed: May 16, 1996

[51] Int. Cl.$^6$ .................................................. G03C 1/498
[52] U.S. Cl. ........................... 430/350; 430/613; 430/619; 430/617
[58] Field of Search ..................................... 430/619, 617, 430/350, 613, 440, 446

[56] References Cited

U.S. PATENT DOCUMENTS

| | | |
|---|---|---|
| 3,457,075 | 7/1969 | Morgan et al. . |
| 3,667,958 | 6/1972 | Evans . |
| 3,751,252 | 8/1973 | Smith et al. . |
| 3,751,255 | 8/1973 | Wilson et al. . |
| 3,794,488 | 2/1974 | Henn et al. . |
| 3,839,049 | 10/1974 | Simons . |
| 3,846,136 | 11/1974 | Sullivan . |
| 3,887,376 | 6/1975 | Wilson et al. . |
| 3,893,863 | 7/1975 | Wilson et al. . |
| 3,933,507 | 1/1976 | von Konig et al. . |
| 3,994,732 | 11/1976 | Winslow . |
| 4,021,249 | 5/1977 | Noguchi et al. . |
| 4,082,901 | 4/1978 | Laridon et al. ........................ 428/480 |
| 4,260,677 | 4/1981 | Winslow et al. ...................... 430/618 |
| 4,269,929 | 5/1981 | Nothnagle . |
| 4,735,884 | 4/1988 | Tsukahara et al. .................... 430/138 |
| 4,772,531 | 9/1988 | Tsukahara et al. .................... 435/138 |
| 4,798,790 | 1/1989 | Thomson et al. ........................ 435/7 |
| 4,891,295 | 1/1990 | Kakimi .................................. 430/138 |
| 4,902,599 | 2/1990 | Yamamoto et al. .................. 430/138 |
| 4,925,832 | 5/1990 | Hall et al. ............................. 564/149 |
| 4,952,474 | 8/1990 | Tsukahara et al. .................. 430/138 |
| 4,970,132 | 11/1990 | Nakamura .......................... 430/138 |
| 5,037,719 | 8/1991 | Nakamura .......................... 430/138 |
| 5,070,132 | 12/1991 | Peccoux et al. ....................... 524/492 |
| 5,185,231 | 2/1993 | Weigel ................................ 430/203 |
| 5,196,288 | 3/1993 | Nakamura .......................... 430/138 |
| 5,246,811 | 9/1993 | Higuchi .............................. 430/138 |
| 5,258,281 | 11/1993 | Tanaka et al. ........................ 430/619 |
| 5,384,238 | 1/1995 | Ellis et al. . |
| 5,536,622 | 7/1996 | Simpson et al. . |
| 5,545,505 | 8/1996 | Simpson . |
| 5,545,507 | 8/1996 | Simpson et al. . |
| 5,545,515 | 8/1996 | Murray et al. ...................... 430/617 |

OTHER PUBLICATIONS

17029, *Research Disclosure*, Jun. 1978.
29963,*Research Disclosure*, Mar. 1989.

*Primary Examiner*—Thorl Chea
*Attorney, Agent, or Firm*—Gregory A. Evearitt; Arlene K. Musser

[57] ABSTRACT

Nitrogen containing 3-heteroaromatic substituted acrylonitrile compounds are useful as co-developers in combination with hindered phenol developers to produce high contrast black-and-white photothermographic and thermographic elements.

The photothermographic and thermographic elements may be used as a photomask in a process where there is a subsequent exposure of an ultraviolet or short wavelength visible radiation-sensitive imageable medium.

22 Claims, No Drawings

3-HETEROARAMATIC-SUBSTITUTED ACRYLONITRILE COMPOUNDS AS CO-DEVELOPERS FOR BLACK-AND-WHITE PHOTOTHERMOGRAPHIC AND THERMOGRAPHIC ELEMENTS

BACKGROUND OF THE INVENTION

1. Field of Invention

3-Heteroaromatic-substituted acrylonitrile compounds are useful as co-developers in combination with hindered phenol developers to produce very high contrast black-and-white photothermographic and thermographic elements.

2. Background of the Art

Silver halide-containing, photothermographic imaging materials (i.e., heat-developable photographic elements) which are developed with heat, without liquid development have been known in the art for many years. These materials are also known as "dry silver" compositions or emulsions and generally comprise a support having coated thereon: (a) a photosensitive compound that generates silver atoms when irradiated; (b) a relatively non-photosensitive, reducible silver source; (c) a reducing agent (i.e., a developer) for silver ion, for example for the silver ion in the non-photosensitive, reducible silver source; and (d) a binder.

The photosensitive compound is generally photographic silver halide which must be in catalytic proximity to the non-photosensitive, reducible silver source. Catalytic proximity requires an intimate physical association of these two materials so that when silver atoms (also known as silver specks, clusters, or nuclei) are generated by irradiation or light exposure of the photographic silver halide, those silver atoms are able to catalyze the reduction of the reducible silver source. It has long been understood that silver atoms ($Ag^°$) are a catalyst for the reduction of silver ions, and that the photosensitive silver halide can be placed into catalytic proximity with the non-photosensitive, reducible silver source in a number of different fashions. The silver halide may be made "in situ," for example by adding a halogen-containing source to the reducible silver source to achieve partial metathesis (see, for example, U.S. Pat. No. 3,457,075); or by coprecipitation of silver halide and the reducible silver source material (see, for example, U.S. Pat. No. 3,839,049). The silver halide may also be made "ex situ" (i.e., be pre-formed) and added to the organic silver salt. The addition of silver halide grains to photothermographic materials is described in *Research Disclosure*, June 1978, Item No. 17029. It is also reported in the art that when silver halide is made ex situ, one has the possibility of controlling the composition and size of the grains much more precisely, so that one can impart more specific properties to the photothermographic element and can do so much more consistently than with the in situ technique.

The non-photosensitive, reducible silver source is a material that contains silver ions. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. Salts of other organic acids or other organic materials, such as silver imidazolates, have been proposed. U.S. Pat. No. 4,260,677 discloses the use of complexes of inorganic or organic silver salts as non-photosensitive, reducible silver Sources.

In both photographic and photothermographic emulsions, exposure of the photographic silver halide to light produces small clusters of silver atoms ($Ag^°$). The imagewise distribution of these clusters is known in the art as a latent image. This latent image is generally not visible by ordinary means. Thus, the photosensitive emulsion must be further developed to produce a visible image. This is accomplished by the reduction of silver ions which are in catalytic proximity to silver halide grains bearing the clusters of silver atoms (i.e., the latent image). This produces a black-and-white image. In photographic elements, the silver halide is reduced to form the black-and-white image. In photothermographic elements, the light-insensitive silver source is reduced to form the visible black-and-white image while much of the silver halide remains as silver halide and is not reduced.

In photothermographic elements the reducing agent for the organic silver salt, often referred to as a "developer," may be any material, preferably any organic material, that can reduce silver ion to metallic silver. At elevated temperatures, in the presence of the latent image, the silver ion of the non-photosensitive reducible silver source (e.g., silver behenate) is reduced by the reducing agent for silver ion. This produces a negative black-and-white image of elemental silver.

While conventional photographic developers such as methyl gallate, hydroquinone, substituted-hydroquinones, catechol, pyrogallol, ascorbic acid, and ascorbic acid derivatives are useful, they tend to result in very reactive photothermographic formulations and cause fog during preparation and coating of photothermographic elements. As a result, hindered phenol reducing agents have traditionally been preferred.

Thermographic imaging constructions (i.e., heat-developable materials) processed with heat, and without liquid development, are widely known in the imaging arts and rely on the use of heat to help produce an image. These elements generally comprise a support or substrate (such as paper, plastics, metals, glass, and the like) having coated thereon: (a) a thermally-sensitive, reducible silver source; (b) a reducing agent for the thermally-sensitive, reducible silver source (i.e., a developer); and (c) a binder.

In a typical thermographic construction, the image-forming layers are based on silver salts of long chain fatty acids. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. At elevated temperatures, silver behenate is reduced by a reducing agent for silver ion such as methyl gallate, hydroquinone, substituted-hydroquinones, hindered phenols, catechol, pyrogallol, ascorbic acid, ascorbic acid derivatives, and the like, whereby an image of elemental silver is formed.

Some thermographic constructions are imaged by contacting them with the thermal head of a thermographic recording apparatus, such as a thermal printer, thermal facsimile, and the like. In such instances, an anti-stick layer is coated on top of the imaging layer to prevent sticking of the thermographic construction to the thermal head of the apparatus utilized. The resulting thermographic construction is then heated to an elevated temperature, typically in the range of about 60°–225° C., resulting in the formation of an image.

The imaging arts have long recognized that the fields of photothermography and thermography are clearly distinct from that of photography. Photothermographic and thermographic elements differ significantly from conventional silver halide photographic elements which require wet-processing. See for example the discussion in U.S. patent application Ser. Nos. 08/530,066 and 08/530,694 both filed Sep. 19, 1995.

U.S. Pat. No. 5,496,695 describes hydrazide compounds useful as co-developers for black-and-white photothermographic and thermographic elements. These elements contain (i) a hindered phenol developer, and (ii) a trityl hydrazide or a formyl phenylhydrazine co-developer, and provide elements having high Dmax (>5.00), fast photospeeds, and high contrast (>20.0).

U.S. patent application Ser. No. 08/529,982 (filed Sep. 19, 1995) describes combinations of hindered phenol developers with acrylonitrile compounds as co-developers for black-and-white photothermographic and thermographic elements. A trityl hydrazide or a formyl phenylhydrazine co-developer may also be included.

U.S. patent application Ser. No. 08/530,024 (filed Sep. 19, 1995) describes combinations of hindered phenol developers, a trityl hydrazide or a formyl phenylhydrazine, and amine compounds as co-developers for black-and-white photothermographic and thermographic elements.

U.S. patent application Ser. No. 08/530,066 (filed Sep. 19, 1995) describes combinations of hindered phenol developers, a trityl hydrazide or a formyl phenylhydrazine, and hydrogen atom donor compounds as co-developers for black-and-white photothermographic and thermographic elements.

U.S. patent application Ser. No. 08/530,694 (filed Sep. 19, 1995) describes combinations of hindered phenol developers, a trityl hydrazide or a formyl phenylhydrazine, and hydroxamic acid compounds as co-developers for black-and-white photothermographic and thermographic elements.

U.S. patent application Ser. No. 08/615,359 (filed Mar. 14, 1996) describes combinations of hindered phenol developers and 2-substituted malon-dialdehyde co-developers for black-and-white photothermographic and thermographic elements.

U.S. patent application Ser. No. 08/615,928 (filed Mar. 14, 1996) describes combinations of hindered phenol developers and 4-substituted isoxazoles as co-developers for black-and-white photothermographic and thermographic elements.

It would be especially desirable to be able to achieve in dry photothermographic or thermographic elements the high contrast that is currently available in wet silver halide materials. It would be advantageous to improve the reactivity of these dry systems, allow the reduction in the amount of silver by lowering the silver coating weights, reduce the amount of developer and co-developer compounds needed to achieve high contrast, and lower costs. New developing agent systems for use in photothermographic and thermographic elements are therefore desired.

SUMMARY OF THE INVENTION

The present invention, shows that a reducing agent system (i.e., a developer system) comprising: (i) at least one hindered phenol developer; and (ii) at least one 3-heteroaromatic-substituted acrylonitrile compound co-developer provides black-and-white photothermographic and thermographic elements having high contrast and high image density (Dmax).

The black-and-white photothermographic elements of the present invention comprise a support bearing at least one photosensitive, image-forming, photothermographic emulsion layer comprising:

(a) a photosensitive silver halide;
(b) a non-photosensitive, reducible silver source;
(c) a reducing agent system for the non-photosensitive, reducible silver source; and
(d) a binder.

wherein the reducing agent system comprises:
(i) at least one hindered phenol developer;
(ii) at least one co-developer (the 3-heteroaromatic-substituted acrylonitrile compound) of the formula:

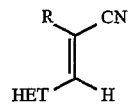

wherein:

R represents an aromatic group or an electron withdrawing group; and

HET represents a 5- or 6-membered heteroaromatic ring attached through a non-quaternary ring nitrogen atom. Preferably the heteroaromatic ring is composed of only carbon and nitrogen atoms (with up to 4 nitrogen atoms), more preferably the ring contains at least two nitrogen atomS, still more preferably the ring contains three nitrogen atoms. Most preferably the ring comprises five ring atoms and is selected from diazole (e.g., imidazoles), triazole, pyrrole, and tetrazole nuclei, with or without exocyclic substitution (including fused or substituent rings, such as those which would then form benzotriazoles, benzodiazoles (e.g., benzimidazoles), benzopyrroles (e.g., indoles), benzotetrazoles, phenylmercaptotetrazoles and the like).

The present invention provides heat-developable, photothermographic and thermographic elements which are capable of providing high photospeeds, stable, high density images with high resolution, good sharpness, high contrast, and good shelf stability. The possibility of low absorbance at 350–450 nm facilitates the use of the elements of this invention in graphic arts applications such as contact printing, proofing, and duplicating ("duping").

When the photothermographic element used in this invention is heat developed, preferably at a temperature of from about 80° C. to about 250° C. (176° F. to 482° F.) for a duration of from about 1 second to about 2 minutes, in a substantially water-free condition after, or simultaneously with, imagewise exposure, a black-and-white silver image is obtained.

In photothermographic elements of the present invention, the layer(s) that contain the photosensitive silver halide and non-photosensitive, reducible silver source are referred to herein as emulsion layer(s). According to the present invention, one or more components of the reducing agent system is added either to the emulsion layer(s) or to a layer(s) adjacent to the emulsion layer(s). Layers that are adjacent to the emulsion layer(s) may be, for example, protective topcoat layers, primer layers, interlayers, opacifying layers, antistatic layers, antihalation layers, barrier layers, auxiliary layers, etc. It is preferred that the reducing agent system be present in the photothermographic emulsion layer or topcoat layer.

The present invention also provides a process for the formation of a visible image by first exposing to electromagnetic radiation and thereafter heating the inventive photothermographic element.

The present invention also provides a process comprising the steps of:

(a) exposing the inventive photothermographic element on a support transparent to ultraviolet radiation or short wavelength visible radiation, to electromagnetic radiation to which the photosensitive silver halide of the element is sensitive, to generate a latent image;

(b) heating the exposed element to develop the latent image into a visible image;

(c) positioning the element with a visible image thereon between a source of ultraviolet or short wavelength visible radiation energy and an ultraviolet or short wavelength radiation photosensitive imageable medium; and (d) thereafter exposing the imageable medium to ultraviolet or short wavelength visible radiation through the visible image on the element, thereby absorbing ultraviolet or short wavelength visible radiation in the areas of the element where there is a visible image and transmitting ultraviolet or short wavelength visible radiation through areas of the element where there is no visible image.

The photothermographic element may be exposed in step (a) with visible, infrared, or laser radiation.

The heat-developable, black-and-white thermographic elements of the present invention comprise a support having coated thereon:

(a) a non-photosensitive, reducible silver source;

(b) a reducing agent system for the non-photosensitive, reducible silver source; and (c) a binder;

wherein the reducing agent system comprises:

(i) at least one hindered phenol developer;

(ii) at least one co-developer (the 3-heteroaromatic-substituted acrylontrile compound) of the formula:

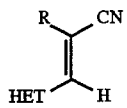

wherein R and HET are as defined above.

In thermographic elements of the present invention, the layer(s) that contain the non-photosensitive reducible silver source are referred to herein as thermographic layer(s) or thermographic emulsion layer(s). When used in thermographic elements according to the present invention, one or more components of the reducing agent system is added either to the thermographic emulsion layer(s) or to a layer(s) adjacent to the emulsion layer(s). Layers that are adjacent to the emulsion layer(s) may be, for example, protective topcoat layers, primer layers, antistatic layers, interlayers, opacifying layers, barrier layers, auxiliary layers, etc. It is preferred that the reducing agent system be present in the thermographic layer or topcoat layer.

When the thermographic element used in this invention is heat developed, preferably at a temperature of from about 80° C. to about 250° C. (176° F. to 482° F.) for a duration of from about 1 second to about 2 minutes in a substantially water-free condition, a black-and-white silver image is obtained.

The present invention also provides a process for the formation of a visible image by heating the inventive thermographic element described earlier herein.

The present invention further provides a process comprising the steps of:

(a) heating the inventive thermographic element on a support transparent to ultraviolet radiation or short wavelength visible radiation at a temperature sufficient to generate a visible image thereon;

(b) positioning the thermographic element with a visible image thereon between a source of ultraviolet or short wavelength visible radiation and an ultraviolet or short wavelength visible radiation photosensitive imageable medium; and (c) thereafter exposing the imageable medium to ultraviolet or short wavelength visible radiation through the visible image on the element, thereby absorbing ultraviolet or short wavelength visible radiation in the areas of the element where there is a visible image and transmitting ultraviolet or short wavelength visible radiation through areas of the element where there is no visible image.

The reducing agent system (i.e., combination of developers and co-developers) used in this invention provide a significant improvement in image contrast when compared to photothermographic and thermographic elements incorporating known developers or known developer combinations.

The photothermographic and thermographic elements of this invention may be used to prepare black-and-white images. The photothermographic material of this invention can be used, for example, in conventional black-and-white photothermography, in electronically generated black-and-white hardcopy recording, in the graphic arts area (e.g., phototypesetting), in digital proofing, and in digital radiographic imaging. The material of this invention provides high photospeeds, strongly absorbing black-and-white images, and a dry and rapid process.

Heating in a substantially water-free condition as used herein, means heating at a temperature of 80° to 250° C. The term "substantially water-free condition" means that the reaction system is approximately in equilibrium with water in the air, and water for inducing or promoting the reaction is not particularly or positively supplied from the exterior to the element. Such a condition is described in T. H. James, *The Theory of the Photographic Process*, Fourth Edition, Macmillan 1977, page 374.

As used herein:

"aryl" means any aromatic ring structure (including fused rings and substituted rings) and preferably represents phenyl or naphthyl.

"emulsion layer" means a layer of a photothermographic element that contains the photosensitive silver halide and non-photosensitive reducible silver source material; or a layer of the thermographic element that contains the non-photosensitive reducible silver source material.

"infrared region of the spectrum" means from about 750 nm to about 1400 nm; "visible region of the spectrum" means from about 400 nm to about 750 nm; and "red region of the spectrum" means from about 640 nm to about 750 nm. Preferably the red region of the spectrum is from about 650 nm to about 700 nm.

"photothermographic element" means a construction comprising at least one photothermographic emulsion layer and any supports, topcoat layers, image receiving layers, blocking layers, antihalation layers, subbing or priming layers, etc.

"short wavelength visible region of the spectrum" means that region of the spectrum from about 400 nm to about 450 nm; and "thermographic element" means a construction comprising at least one thermographic emulsion layer and any supports, topcoat layers, image receiving layers, blocking layers, antihalation layers, subbing or priming layers, etc.

"ultraviolet region of the spectrum" means that region of the spectrum less than or equal to about 400 nm, preferably from about 100 nm to about 400 nm. More preferably, the ultraviolet region of the spectrum is the region between about 190 nm and about 400 nm;

In the foregoing-disclosed formulae R and HET may contain additional substituent groups. As is well understood in this area, substitution is not only tolerated, but is often advisable and substitution is anticipated on the compounds used in the present invention. As a means of simplifying the discussion and recitation of certain substituent groups, the terms "group" and "moiety" are used to differentiate between those chemical species that may be substituted and those which may not be so substituted. Thus, when the term "group," such as "aryl group," is used to describe a substituent, that substituent includes the use of additional substituents beyond the literal definition of the basic group. Where the term "moiety" is used to describe a substituent, only the unsubstituted group is intended to be included. For example, the phrase, "alkyl group" is intended to include not only pure hydrocarbon alkyl chains, such as methyl, ethyl, propyl, t-butyl, cyclohexyl, iso-octyl, octadecyl and the like, but also alkyl chains bearing substituents known in the art, such as hydroxyl, alkoxy, phenyl, halogen atoms (F, Cl, Br, and I), cyano, nitro, amino, carboxy, etc. For example, alkyl group includes ether groups (e.g., $CH_3$—$CH_2$—$CH_2$—O—$CH_2$—), haloalkyls, nitroalkyls, carboxyalkyls, hydroxyalkyls, sulfoalkyls, etc. On the other hand, the phrase "alkyl moiety" is limited to the inclusion of only pure hydrocarbon alkyl chains, such as methyl, ethyl, propyl, t-butyl, cyclohexyl, iso-octyl, octadecyl, and the like. Substituents that adversely react with other active ingredients, such as very strongly electrophilic or oxidizing substituents, would of course be excluded by the ordinarily skilled artisan as not being inert or harmless.

Other aspects, advantages, and benefits of the present invention are apparent from the detailed description, examples, and claims.

DETAILED DESCRIPTION OF THE INVENTION

In photothermographic elements there exists the desire for products which exhibit increased contrast upon exposure to light and subsequent development. This desire is based upon the realization that contrast is directly related to the appearance of sharpness. Thus, products which exhibit increased contrast give the visual impression of enhanced sharpness.

Traditionally contrast has been defined by two methods, both of which are derived from the D-Log E curve. The first method is the determination of gamma, γ, which is defined as the slope of the straight-line section of the D-log E curve between two specified densities. The second is the determination of the overall sharpness of the toe section of the D-log E curve. By sharpness of the toe section, it is usually meant the relative change in density with exposure in the toe section of the traditional D-Log E curve. For instance, a sharp toe corresponds to a very rapid rise in density (at low levels of density) with exposure, whereas a soft toe corresponds to a very gradual rise in density (at low levels of density) with exposure. If either the value of γ is high or the toe is sharp, then the image has a relatively high contrast. If the value of γ is low, or the toe is soft, the image has a relatively low contrast. Contrast must be also be maintained throughout the exposure range. Thus, high γ at densities between about 2.0 and Dmax is also required to achieve sharp images.

The contrast must be optimized for each particular use. For some uses, certain parts of the sensitometric curve must be modified to increase or decrease the contrast of the product.

Photothermographic and thermographic systems have not found widespread use as replacement for wet silver halide in imaging systems because of slow speed, low Dmax, poor contrast, and insufficient sharpness at high Dmax. European Laid Open Patent Application No. 0 627 660 and U.S. Pat. No. 5,434,043 describe most of the characteristics and attributes of a photothermographic element having, for example, an antihalation system, silver halide grains having an average particle size of less than 0.10 μm, and infrared supersensitization leading to an infrared photothermographic article meeting the requirements for medical or graphic arts laser recording applications.

Conventional photothermographic elements comprising only bisphenol developers rarely exhibit a γ greater than about 3.0. These materials are well suited to medical imaging and similar uses where continuous tone reproduction is required but are not adequate for graphic arts uses where a much higher γ (e.g., >5.0) is necessary.

The shape of the sensitometric D-Log E curve for photothermographic elements of this invention incorporating 3-heteroaromatic substituted acrylonitrile compounds as co-developers is similar to that observed for infectious development curves in hard dot black-and-white conventionally processed wet silver halide image-setting films. This allows the preparation of improved hard dot dry silver masks of high image quality useful for the production of plates in image-setting applications, contact proofs, and duplicating films also useful in the graphic arts. These masks are presently produced from conventional wet silver halide materials.

The Reducing Agent System for the Non-Photosensitive Reducible Silver Source

In the black-and-white photothermographic and thermographic elements of the present invention the reducing agent system (i.e., the developer system) for the organic silver salt comprises at least one hindered phenol compound and at least one co-developer of the formula:

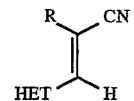

wherein R and HET are as defined above.

Hindered phenol developers are compounds that contain only one hydroxy group on a given phenyl ring and have at least one additional substituent located ortho to the hydroxy group. They differ from traditional photographic developers which contain two hydroxy groups on the same phenyl ring (such as is found in hydroquinones). Hindered phenol developers may contain more than one hydroxy group as long as each hydroxy group is located on different phenyl rings. Hindered phenol developers include, for example, binaphthols (i.e., dihydroxybinaphthyls), biphenols (i.e., dihydroxybiphenyls), bis(hydroxynaphthyl)methanes, bis(hydroxyphenyl)methanes, hindered phenols, and hindered naphthols, each of which may be variously substituted.

Non-limiting representative binaphthols include 1,1'-bi-2-naphthol; 1,1'-bi-4-methyl-2-naphthol; and 6,6'-dibromo-bi-2-naphthol. For additional compounds see U.S. Pat. No. 5,262,295 at column 6, lines 12–13, incorporated herein by reference.

Non-limiting representative biphenols include 2,2'-dihydroxy-3,3'-di-t-butyl5,5-dimethylbiphenyl; 2,2'-dihydroxy-3,3',5,5'-tetra-t-butylbiphenyl; 2,2'-dihydroxy3,3'-di-t-butyl-5,5'-dichlorobiphenyl; 2-(2-hydroxy-3-t-butyl-5-methylphenyl)4-methyl-6-n-hexylphenol; 4,4'-dihydroxy- 3,3',5,5'-tetra-t-butylbiphenyl; and 4,4'-dihydroxy-3,3',5,5'-tetramethylbiphenyl. For additional compounds see U.S. Pat. No. 5,262,295 at column 4, lines 17–47, incorporated herein by reference.

Non-limiting representative bis(hydroxynaphthyl) methanes include 4,4'-methylenebis(2-methyl-1-naphthol). For additional compounds see U.S. Pat. No. 5,262,295 at column 6, lines 14–16, incorporated herein by reference.

Non-limiting representative bis(hydroxyphenyl)methanes include bis(2-hydroxy-3-t-butyl-5-methylphenyl)methane (CAO-5); 1,1-bis(2-hydroxy-3,5-dimethylphenyl)-3,5,5-trimethylhexane (Permanax™); 1,1-bis(3,5-di-t-butyl-4-hydroxyphenyl)methane; 2,2-bis(4-hydroxy-3-methylphenyl)propane; 4,4-ethylidene-bis(2-t-butyl-6-methylphenol); and 2,2-bis(3,5-dimethyl-4-hydroxyphenyl) propane. For additional compounds see U.S. Pat. No. 5,262,295 at column 5, line 63, to column 6, line 8, incorporated herein by reference.

Non-limiting representative hindered phenols include 2,6-di-t-butylphenol; 2,6-di-t-butyl-4-methylphenol; 2,4-di-t-butylphenol; 2,6-dichlorophenol; 2,6-dimethylphenol; and 2-t-butyl-6-methylphenol.

Non-limiting representative hindered naphthols include 1-naphthol; 4-methyl-1-naphthol; 4-methoxy-1-naphthol; 4-chloro-1-naphthol; and 2-methyl-1-naphthol. For additional compounds see U.S. Pat. No. 5,262,295 at column 6, lines 17–20, incorporated herein by reference.

The co-developer may be a 3-heteroaromatic substituted acrylonitrile compound or a mixture of 3-heteroaromatic substituted acrylonitrile compounds.

The 3-heteroaromatic substituted acrylonitrile compounds are also required to have an electron withdrawing group R attached at the position noted in the formulae. The R group on the 2-substituted position of the 3-heteroaromatic substituted acrylonitrile compound may have substitution.

As used herein, the electron withdrawing nature of R is determined by its "Hammet $\sigma_P$ value." The Hammett $\sigma_P$ constant is defined by the Hammett Equation $\log K/K° = \sigma_P \rho$ where K° is the acid dissociation constant of the reference in aqueous solution at 25° C., K is the corresponding constant for the para-substituted acid, and $\rho$ is defined as 1.0 for the dissociation of para-substituted benzoic acids. A positive Hammett sigma ($\sigma$) indicates the group is electron withdrawing. Phenyl, although being found in references to have a Hammett sigma value of −0.01 or 0 should also be acceptable.

R may be an aryl group or any electron withdrawing group. Aryl includes any aromatic single or multiple ring group with or without substitution, such as, for example, phenyl, naphthyl, tolyl, pyridyl, furyl, etc. It is preferred that the aryl group, in its effect upon the 2-position of the 3-heteroaromatic substituted acrylonitrile compound is electron withdrawing. It is also preferred that the electron withdrawing group have a Hammett $\sigma_P$ value greater than 0.20 preferably greater than 0.35. Non limiting examples of electron withdrawing groups include cyano, halogen (e.g., bromo, chloro, iodo), formyl, alkoxycarbonyl, metaloxycarbonyl, hydroxycarbonyl, nitro, acetyl, perfluoroalkyl, alkylsulfonyl, arylsulfonyl as well as other groups listed in Lange's *Handbook of Chemistry*, 14th Edition, McGraw-Hill, 1992; Chapter 9, pp 2–7.

HET comprises a 5- or 6-membered heteroaromatic ring attached through a non-quaternary nitrogen atom. Preferably the heteroaromatic ring is composed of only carbon and nitrogen atoms (with up to 4 nitrogen atoms), more preferably the ring contains at least two nitrogen atoms, still more preferably the ring contains three nitrogen atoms. Most preferably the ring comprises five ring atoms and is selected from diazole, triazole, pyrrole and tetrazole nuclei, with or without exocyclic substitution (which is inclusive of the formation of fused benzene rings as in forming benzodiazoles, benzotriazoles, benzotetrazoles, benzopyrroles and the like, with or without additional substitution on the benzene rings). The description of the attachment of HET through a "non-quaternary ring nitrogen" within the HET heteroaromatic ring is thought to be important to the practice of the present invention. The attachment through the nitrogen atom is essential, and attachment through a ring nitrogen atom with only three covalently bonded groups (and therefore not having a charge of $N^+$ and being quaternary) is also though to be important.

3-Heteroaromatic substituted acrylonitrile compounds may be prepared by reaction of an 3-chloroacrylonitrile compound with an appropriately substituted heteroaromatic compound. Representative 3-heteroaromatic substituted acrylonitrile compounds are shown below. These representations are exemplary and are not intended to be limiting.

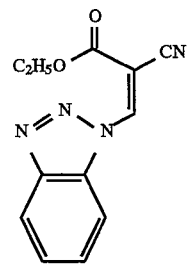

HET-01

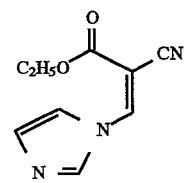

HET-02

In the reducing agent system, the hindered phenol developer should be present at from 1 to 15% by weight of the imaging layer. The 3-heteroaromatic substituted acrylonitrile compound co-developer should be present at from 0.01 to 1.5% by weight of the imaging layer.

The mounts of the above described reducing agents of the reducing agent system that are added to the photothermographic or thermographic element of the present invention may be varied depending upon the particular compound used, upon the type of emulsion layer, and whether components of the reducing agent system are located in the emulsion layer or a topcoat layer. However, when present in the emulsion layer, the hindered phenol should be present in an amount of from 0.01 to 50 mole, preferably from 0.05 to 25 mole; the 3-heteroaromatic substituted acrylonitrile compound should be present in an amount of from 0.0005 to 25 mole, preferably from 0.0025 to 10 mole per mole of the silver halide.

In multilayer constructions, if one of the developers of the reducing agent system is added to a layer other than the emulsion layer, slightly higher proportions may be necessary and the hindered phenol should be present at from 2 to 20% by weight; the substitued 3-heteroaromatic substituted acrylonitrile co-developer when used should be present at from 0.2 to 20% by weight of the layer in which it is present.

Photothermographic elements of the invention may contain other co-developers or mixtures of co-developers in combination with the 3-heteroaromatic substituted acrylonitrile co-developers of this invention. For example, the trityl hydrazide or formyl phenylhydrazine compounds described in U.S. Pat. No. 5,496,695 may be used; the acrylonitrile compounds described in U.S. patent application Ser. No. 08/529,982 (filed Sep. 19, 1995) may be used; the amine compounds described in U.S. patent application Ser. No. 08/530,024 (filed Sep. 19, 1995) may be used; the hydrogen atom donor compounds described in U.S. patent application Ser. No. 08/530,066 (filed Sep. 19, 1995) may be used; the hydroxamic acid compounds described in U.S. patent application Ser. No. 08/530,694 (filed Sep. 19, 1995) may be used; the 2-substituted malondialdehyde compounds described in U.S. patent application Ser. No. 08/615,359 (filed Mar. 14, 1996) may be used; and the 4-substituted isoxazole compounds described in U.S. patent application Ser. No. 08/615,928 (filed Mar. 14,1996) may be used.

Photothermographic elements of the invention may also contain other additives such as shelf-life stabilizers, toners, development accelerators, acutance dyes, post-processing stabilizers or stabilizer precursors, and other image-modifying agents.

The Photosensitive Silver Halide

As noted above, when used in a photothermographic element, the present invention includes a photosensitive silver halide. The photosensitive silver halide can be any photosensitive silver halide, such as silver bromide, silver iodide, silver chloride, silver bromoiodide, silver chlorobromoiodide, silver chlorobromide, etc. The photosensitive silver halide can be added to the emulsion layer in any fashion so long as it is placed in catalytic proximity to the light-insensitive reducible silver compound which serves as a source of reducible silver.

The silver halide may be in any form which is photosensitive including, but not limited to cubic, octahedral, rhombic dodecahedral, orthorhombic, tetrahedral, other polyhedral habits, etc., and may have epitaxial growth of crystals thereon.

The silver halide grains may have a uniform ratio of halide throughout; they may have a graded halide content, with a continuously varying ratio of, for example, silver bromide and silver iodide; or they may be of the core-shell-type, having a discrete core of one halide ratio, and a discrete shell of another halide ratio. Core-shell silver halide grains useful in photothermographic elements and methods of preparing these materials are described in U.S. Pat. No. 5,382,504. A core-shell silver halide grain having an iridium doped core is particularly preferred. Iridium doped core-shell grains of this type are described in U.S. Pat. No. 5,434,043.

The silver halide may be prepared ex situ, (i.e., be pre-formed) and mixed with the organic silver salt in a binder prior to use to prepare a coating solution. The silver halide may be pre-formed by any means, e.g., in accordance with U.S. Pat. No. 3,839,049. For example, it is effective to blend the silver halide and organic silver salt using a homogenizer for a long period of time. Materials of this type are often referred to as "pre-formed emulsions." Methods of preparing these silver halide and organic silver salts and manners of blending them are described in *Research Disclosure*, June 1978, item 17029; U.S. Pat. Nos. 3,700,458 and 4,076,539; and Japanese Patent Application Nos. 13224/74, 42529/76, and 17216/75.

It is desirable in the practice of this invention to use pre-formed silver halide grains of less than 0.10 μm in an infrared sensitized, photothermographic material. It is also preferred to use iridium doped silver halide grains and iridium doped core-shell silver halide grains as disclosed in European Laid Open Patent Application No. 0 627 660 and U.S. Pat. No. 5,434,043 described above.

Pre-formed silver halide emulsions when used in the material of this invention can be unwashed or washed to remove soluble salts. In the latter case, the soluble salts can be removed by chill-setting and leaching or the emulsion can be coagulation washed, e.g., by the procedures described in U.S. Pat. Nos. 2,618,556; 2,614,928; 2,565,418; 3,241,969; and 2,489,341.

It is also effective to use an in situ process, i.e., a process in which a halogen-containing compound is added to an organic silver salt to partially convert the silver of the organic silver salt to silver halide.

The light-sensitive silver halide used in the present invention can be employed in a range of about 0.005 mole to about 0.5 mole; preferably, from about 0.01 mole to about 0.15 mole per mole; and more preferably, from 0.03 mole to 0.12 mole of silver halide per mole of non-photosensitive reducible silver salt.

The silver halide used in the present invention may be chemically and spectrally sensitized in a manner similar to that used to sensitize conventional wet-processed silver halide or state-of-the-art heat-developable photographic materials.

For example, it may be chemically sensitized with a chemical sensitizing agent, such as a compound containing sulfur, selenium, tellurium, etc., or a compound containing gold, platinum, palladium, ruthenium, rhodium, iridium, or combinations thereof, etc., a reducing agent such as a tin halide, etc., or a combination thereof. The details of these procedures are described in T. H. James, *The Theory of the Photographic Process*, Fourth Edition, Chapter 5, pp. 149 to 169. Suitable chemical sensitization procedures are also disclosed in Shepard, U.S. Pat. No. 1,623,499; Waller, U.S. Pat. No. 2,399,083; McVeigh, U.S. Pat. No. 3,297,447; and Dunn, U.S. Pat. No. 3,297,446.

Addition of sensitizing dyes to the photosensitive silver halides serves to provide them with high sensitivity to visible and infrared light by spectral sensitization. Thus, the photosensitive silver halides may be spectrally sensitized with various known dyes that spectrally sensitize silver halide. Non-limiting examples of sensitizing dyes that can be employed include cyanine dyes, merocyanine dyes, complex cyanine dyes, complex merocyanine dyes, holopolar cyanine dyes, hemicyanine dyes, styryl dyes, and hemioxanol dyes. Of these dyes, cyanine dyes, merocyanine dyes, and complex merocyanine dyes are particularly useful. Cyanine dyes described in U.S. Pat. No. 5,441,866 and in U.S. patent application Ser. No. 08/425,860 (filed Apr. 20, 1995) are particularly effective.

An appropriate amount of sensitizing dye added is generally about $10^{-10}$ to $10^{-1}$ mole; and preferably, about $10^{-8}$ to $10^{-3}$ moles of dye per mole of silver halide.

Supersensitizers

To get the speed of the photothermographic elements up to maximum levels and further enhance sensitivity, it is often desirable to use supersensitizers. Any supersensitizer can be used which increases the sensitivity. For example, preferred infrared supersensitizers are described in European Laid Open Patent Application No. 0 559 228 and include heteroaromatic mercapto compounds or heteroaromatic disulfide compounds of the formulae:

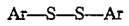

wherein: M represents a hydrogen atom or an alkali metal atom.

In the above noted supersensitizers, Ar represents groups comprising an aromatic ring, a heterocyclic ring, or an aromatic ring fused to a heterocyclic ring containing one or more of nitrogen, sulfur, oxygen, selenium or tellurium atoms.

Preferred supersensitizers are 2-mercaptobenzimidazole, 2-mercapto-5-methylbenzimidazole, 2-mercaptobenzothiazole, and 2-mercaptobenzoxazole.

The supersensitizers are used in a general amount of at least 0.001 moles of sensitizer per mole of silver in the emulsion layer. Usually the range is between 0.001 and 1.0 moles of the compound per mole of silver and preferably between 0.01 and 0.3 moles of compound per mole of silver.

The Non-Photosensitive Reducible Silver Source Material

When used in photothermographic and thermographic elements, the present invention includes a non-photosensitive reducible silver source. The non-photosensitive reducible silver source that can be used in the present invention can be any material that contains a source of reducible silver ions. Preferably, it is a silver salt which is comparatively stable to light and forms a silver image when heated to 80° C. or higher in the presence of an exposed photocatalyst (such as silver halide) and a reducing agent.

Silver salts of organic acids, particularly silver salts of long chain fatty carboxylic acids, are preferred. The chains typically contain 10 to 30, preferably 15 to 28, carbon atoms. Suitable organic silver salts include silver salts of organic compounds having a carboxyl group. Examples thereof include a silver salt of an aliphatic carboxylic acid and a silver salt of an aromatic carboxylic acid. Preferred examples of the silver salts of aliphatic carboxylic acids include silver behenate, silver stearate, silver oleate, silver laurate, silver caprate, silver myristate, silver palmitate, silver maleate, silver fumarate, silver tartarate, silver furoate, silver linoleate, silver butyrate, silver camphorate, and mixtures thereof, etc. Silver salts that can be substituted with a halogen atom or a hydroxyl group also can be effectively used. Preferred examples of the silver salts of aromatic carboxylic acid and other carboxyl group-containing compounds include: silver benzoate, a silver-substituted benzoate, such as silver 3,5-dihydroxybenzoate, silver o-methylbenzoate, silver m-methylbenzoate, silver p-methylbenzoate, silver 2,4-dichlorobenzoate, silver acetamidobenzoate, silver p-phenylbenzoate, etc.; silver gallate; silver tannate; silver phthalate; silver terephthalate; silver salicylate; silver phenylacetate; silver pyromellilate; a silver salt of 3-carboxymethyl-4-methyl-4-thiazoline-2-thione or the like as described in U.S. Pat. No. 3,785,830; and a silver salt of an aliphatic carboxylic acid containing a thioether group as described in U.S. Pat. No. 3,330,663.

Silver salts of compounds containing mercapto or thione groups and derivatives thereof can also be used. Preferred examples of these compounds include: a silver salt of 3-mercapto-4-phenyl-1,2,4-triazole; a silver salt of 2-mercaptobenzimidazole; a silver salt of 2-mercapto-5-aminothiadiazole; a silver salt of 2-(2-ethylglycolamido) benzothiazole; a silver salt of thioglycolic acid, such as a silver salt of a S-alkylthioglycolic acid (wherein the alkyl group has from 12 to 22 carbon atoms); a silver salt of a dithiocarboxylic acid such as a silver salt of dithioacetic acid; a silver salt of thioamide; a silver salt of 5-carboxylic-1-methyl-2-phenyl-4-thiopyridine; a silver salt of mercaptotriazine; a silver salt of 2-mercaptobenzoxazole; a silver salt as described in U.S. Pat. No. 4,123,274, for example, a silver salt of a 1,2,4-mercaptothiazole derivative, such as a silver salt of 3-amino-5-benzylthio1,2,4-thiazole; and a silver salt of a thione compound, such as a silver salt of 3-(2-carboxyethyl)-4-methyl-4-thiazoline-2-thione as disclosed in U.S. Pat. No. 3,201,678.

Furthermore, a silver salt of a compound containing an imino group can be used. Preferred examples of these compounds include: silver salts of benzotriazole and substituted derivatives thereof, for example, silver methylbenzotriazole and silver 5-chlorobenzotriazole, etc.; silver salts of 1,2,4-triazoles or 1-H-tetrazoles as described in U.S. Pat. No. 4,220,709; and silver salts of imidazoles and imidazole derivatives.

Silver salts of acetylenes can also be used. Silver acetylides are described in U.S. Pat. Nos. 4,761,361 and 4,775,613.

It is also found convenient to use silver half soaps. A preferred example of a silver half soap is an equimolar blend of silver behenate and behenic acid, which analyzes for about 14.5% by weight silver and which is prepared by precipitation from an aqueous solution of the sodium salt of commercial behenic acid.

Transparent sheet materials made on transparent film backing require a transparent coating. For this purpose a silver behenate full soap, containing not more than about 15% of free behenic acid and analyzing about 22% silver, can be used.

The method used for making silver soap emulsions is well known in the art and is disclosed in *Research Disclosure*, April 1983, item 22812, *Research Disclosure*, October 1983, item 23419, and U.S. Pat. No. 3,985,565.

The silver halide and the non-photosensitive reducible silver source material that form a starting point of development should be in catalytic proximity, i.e., reactive association. "Catalytic proximity" or "reactive association" means that they should be in the same layer, in adjacent layers, or in layers separated from each other by an intermediate layer having a thickness of less than 1 micrometer (1 µm). It is preferred that the silver halide and the non-photosensitive reducible silver source material be present in the same layer.

Photothermographic emulsions containing pre-formed silver halide in accordance with this invention can be sensitized with chemical sensitizers, or with spectral sensitizers as described above.

The source of reducible silver material generally constitutes about 5 to about 70% by weight of the emulsion layer. It is preferably present at a level of about 10 to about 50% by weight of the emulsion layer.

The Binder

The photosensitive silver halide, the non-photosensitive reducible source of silver, the reducing agent system, and any other addenda used in the present invention are generally added to at least one binder. The binder(s) that can be used in the present invention can be employed individually or in combination with one another. It is preferred that the binder be selected from polymeric materials, such as, for example, natural and synthetic resins that are sufficiently polar to hold the other ingredients in solution or suspension.

A typical hydrophilic binder is a transparent or translucent hydrophilic colloid. Examples of hydrophilic binders include: a natural substance, for example, a protein such as gelatin, a gelatin derivative, a cellulose derivative, etc.; a polysaccharide such as starch, gum arabic, pullulan, dextrin, etc.; and a synthetic polymer, for example, a water-soluble polyvinyl compound such as polyvinyl alcohol, polyvinyl pyrrolidone, acrylamide polymer, etc. Another example of a hydrophilic binder is a dispersed vinyl compound in latex form which is used for the purpose of increasing dimensional stability of a photographic element.

Examples of typical hydrophobic binders are polyvinyl acetals, polyvinyl chloride, polyvinyl acetate, cellulose acetate, polyolefins, polyesters, polystyrene, polyacrylonitrile, polycarbonates, methacrylate copolymers, maleic anhydride ester copolymers, butadiene-styrene copolymers, and the like. Copolymers, e.g., terpolymers, are also included in the definition of polymers. The polyvinyl acetals, such as polyvinyl butyral and polyvinyl formal, and vinyl copolymers such as polyvinyl acetate and polyvinyl chloride are particularly preferred.

Although the binder can be hydrophilic or hydrophobic, preferably it is hydrophobic in the silver containing layer(s). Optionally, these polymers may be used in combination of two or more thereof.

The binders are preferably used at a level of about 30–90% by weight of the emulsion layer, and more preferably at a level of about 45–85% by weight. Where the proportions and activities of the reducing agent system for the non-photosensitive reducible source of silver require a particular developing time and temperature, the binder should be able to withstand those conditions. Generally, it is preferred that the binder not decompose or lose its structural integrity at 250° F. (121° C.) for 60 seconds, and more preferred that it not decompose or lose its structural integrity at 350° F. (177° C.) for 60 seconds.

The polymer binder is used in an amount sufficient to carry the components dispersed therein, that is, within the effective range of the action as the binder. The effective range can be appropriately determined by one skilled in the art.

Photothermographic and Thermographic Formulations

The formulation for the photothermographic and thermographic emulsion layer can be prepared by dissolving and dispersing the binder, the photosensitive silver halide, (when used) the non-photosensitive reducible source of silver, the reducing agent system for the non-photosensitive reducible silver source, and optional additives, in an inert organic solvent, such as, for example, toluene, 2-butanone, or tetrahydrofuran.

The use of "toners" or derivatives thereof which improve the image, is highly desirable, but is not essential to the element. Toners can be present in an amount of about 0.01–10% by weight of the emulsion layer, preferably about 0.1–10% by weight. Toners are well known materials in the photothermographic and thermographic art, as shown in U.S. Pat. Nos. 3,080,254; 3,847,612; and 4,123,282.

Examples of toners include: phthalimide and N-hydroxyphthalimide; cyclic imides, such as succinimide, pyrazoline-5-ones, quinazolinone, 1-phenylurazole, 3-phenyl-2-pyrazoline-5-one, and 2,4-thiazolidinedione; naphthalimides, such as N-hydroxy-1,8-naphthalimide; cobalt complexes, such as cobaltic hexamine trifluoroacetate; mercaptans such as 3-mercapto-1,2,4-triazole, 2,4-dimercaptopyrimidine, 3-mercapto-4,5-diphenyl-1,2,4-triazole and 2,5-dimercapto-1,3,4-thiadiazole; N-(aminomethyl)aryldicarboximides, such as (N,N-dimethylaminomethyl)phthalimide, and N-(dimethylaminomethyl)naphthalene-2,3-dicarboximide; a combination of blocked pyrazoles, isothiuronium derivatives, and certain photobleach agents, such as a combination of N,N'-hexamethylene-bis(1-carbamoyl-3,5-dimethylpyrazole), 1,8-(3,6-diazaoctane)bis(isothiuronium) trifluoroacetate, and 2-(tribromomethylsulfonyl benzothiazole): merocyanine dyes such as 3-ethyl-5-[(3-ethyl-2-benzothiazolinylidene)-1-methyl-ethylidene]-2-thio-2,4-o-azolidinedione; phthalazinone, phthalazinone derivatives, or metal salts or these derivatives, such as 4-(1-naphthyl)phthalazinone, 6-chlorophthalazinone, 5,7-dimethoxyphthalazinone, and 2,3-dihydro1,4-phthalazinedione; a combination of phthalazine plus one or more phthalic acid derivatives, such as phthalic acid, 4-methylphthalic acid, 4-nitrophthalic acid, and tetrachlorophthalic anhydride, quinazolinediones, benzoxazine or naphthoxazine derivatives; rhodium complexes functioning not only as tone modifiers but also as sources of halide ion for silver halide formation in situ, such as ammonium hexachlororhodate (III), rhodium bromide, rhodium nitrate, and potassium hexachlororhodate (III); inorganic peroxides and persulfates, such as ammonium peroxydisulfate and hydrogen peroxide; benzoxazine-2,4-diones, such as 1,3-benzoxazine-2,4-dione, 8-methyl-1,3-benzoxazine-2,4-dione, and 6-nitro-1,3-benzoxazine-2,4-dione; pyrimidines and asym-triazines, such as 2,4-dihydroxypyrimidine, 2-hydroxy4-aminopyrimidine, and azauracil; and tetraazapentalene derivatives, such as 3,6-dimercapto- 1,4-diphenyl-1H,4H-2,3a,5,6a-tetraazapentalene and 1,4-di-(o-chlorophenyl)-3,6-dimercapto-1H,4H-2,3a,5,6a-tetraazapentalene.

The photothermographic elements used in this invention can be further protected against the production of fog and can be stabilized against loss of sensitivity during storage. While not necessary for the practice of the invention, it may be advantageous to add mercury (II) salts to the emulsion layer(s) as an antifoggant. Preferred mercury (II) salts for this purpose are mercuric acetate and mercuric bromide.

Other suitable antifoggants and stabilizers, which can be used alone or in combination, include the thiazolium salts described in U.S. Pat. Nos. 2,131,038 and U.S. Pat. No. 2,694,716; the azaindenes described in U.S. Pat. Nos. 2,886, 437; the triazaindolizines described in U.S. Pat. No. 2,444, 605; the mercury salts described in U.S. Pat. No. 2,728,663; the urazoles described in U.S. Pat. No. 3,287,135; the sulfocatechols described in U.S. Pat. No. 3,235,652; the oximes described in British Pat. No. 623,448; the polyvalent metal salts described in U.S. Pat. No. 2,839,405; the thiuronium salts described in U.S. Pat. No. 3,220,839; the palladium, platinum and gold salts described in U.S. Pat. Nos. 2,566,263 and 2,597,915; and the 2-(tribromomethylsulfonyl)quinolines described in U.S. Pat. No. 5,460,938. Stabilizer precursor compounds capable of releasing stabilizers upon application of heat during development can also be use in combination with the stabilizers of this invention. Such precursor compounds are described in, for example, U.S. Pat. Nos. 5,158,866, 5,175,081, 5,298, 390, and 5,300,420

Photothermographic and thermographic elements of the invention can contain plasticizers and lubricants such as polyalcohols and diols of the type described in U.S. Pat. No. 2,960,404; fatty acids or esters, such as those described in U.S. Pat. Nos. 2,588,765 and 3,121,060; and silicone resins, such as those described in British Patent No. 955,061.

Photothermographic and thermographic elements containing emulsion layers described herein may contain matting agents such as starch, titanium dioxide, zinc oxide, silica, and polymeric beads including beads of the type described in U.S. Pat. Nos. 2,992,101 and 2,701,245.

Emulsions in accordance with this invention may be used in photothermographic and thermographic elements which contain antistatic or conducting layers, such as layers that comprise soluble salts, e.g., chlorides, nitrates, etc., evaporated metal layers, ionic polymers such as those described in U.S. Pat. Nos. 2,861,056, and 3,206,312 or insoluble inorganic salts such as those described in U.S. Pat. No. 3,428, 451.

The photothermographic and thermographic elements of this invention may also contain electroconductive underlayers to reduce static electricity effects and improve transport through processing equipment. Such layers are described in U.S. Pat. No. 5,310,640.

Photothermographic Constructions

The photothermographic and thermographic elements of this invention may be constructed of one or more layers on a support. Single layer elements should contain the silver halide (when used), the non-photosensitive, reducible silver source material, the reducing agent system for the non-photosensitive reducible silver source, the binder as well as optional materials such as toners, acutance dyes, coating aids, and other adjuvants.

Two-layer constructions should contain silver halide (when used) and nonphotosensitive, reducible silver source in one emulsion layer (usually the layer adjacent to the support) and the other ingredients in the second layer or distributed between both layers. Two layer constructions comprising a single emulsion layer coating containing all the ingredients and a protective topcoat are envisioned.

Photothermographic and thermographic emulsions used in this invention can be coated by various coating procedures including wire wound rod coating, dip coating, air knife coating, curtain coating, or extrusion coating using hoppers of the type described in U.S. Pat. No. 2,681,294. If desired, two or more layers can be coated simultaneously by the procedures described in U.S. Pat. Nos. 2,761,791; 5,340, 613; and British Patent No. 837,095. Typical wet thickness of the emulsion layer can be about 10–150 micrometers (μm), and the layer can be dried in forced air at a temperature of about 20°–100° C. It is preferred that the thickness of the layer be selected to provide maximum image densities greater than 0.2, and, more preferably, in the range 0.5 to 4.0, as measured by a MacBeth Color Densitometer Model TD 504.

Photothermographic and thermographic elements according to the present invention can contain acutance dyes and antihalation dyes. The dyes may be incorporated into the photothermographic emulsion layer as acutance dyes according to known techniques. The dyes may also be incorporated into antihalation layers according to known techniques as an antihalation backing layer, an antihalation underlayer or as an overcoat. It is preferred that the photothermographic elements of this invention contain an antihalation coating on the support opposite to the side on which the emulsion and topcoat layers are coated. Antihalation and acutance dyes useful in the present invention are described in U.S. Pat. Nos. 5, 135,842; 5,266,452; 5,314,795; and 5,380,635.

Development conditions will vary, depending on the construction used, but will typically involve heating the imagewise exposed material at a suitably elevated temperature. When used in a photothermographic element, the latent image obtained after exposure can be developed by heating the material at a moderately elevated temperature of, for example, about 80°–250° C., preferably about 100°–200° C., for a sufficient period of time, generally about 1 second to about 2 minutes. Heating may be carried out by the typical heating means such as a hot plate, an iron, a hot roller, a heat generator using carbon or titanium white, a resistive layer in the element, or the like.

If desired, the imaged element may be subjected to a first heating step at a temperature and for a time sufficient to intensify and improve the stability of the latent image but insufficient to produce a visible image and later subjected to a second heating step at a temperature and for a time sufficient to produce the visible image. Such a method and its advantages are described in U.S. Pat. No. 5,279,928.

When used in a thermographic element, the image may be developed merely by heating at the above noted temperatures using a thermal stylus or print head, or by heating while in contact with a heat absorbing material.

Thermographic elements of the invention may also include a dye to facilitate direct development by exposure to laser radiation. Preferably the dye is an infrared absorbing dye and the laser is a diode laser emitting in the infrared. Upon exposure to radiation the radiation absorbed by the dye is converted to heat which develops the thermographic element.

The Support

Photothermographic and thermographic emulsions used in the invention can be coated on a wide variety of supports. The support, or substrate, can be selected from a wide range of materials depending on the imaging requirement. Supports may be transparent or at least translucent. Typical supports include polyester film, subbed polyester film (e.g., polyethylene terephthalate or polyethylene naphthalate), cellulose acetate film, cellulose ester film, polyvinyl acetal film, polyolefinic film (e.g., polethylene or polypropylene or blends thereof), polycarbonate film and related or resinous materials, as well as glass, paper, and the like. Typically, a flexible support is employed, especially a polymeric film support, which can be partially acetylated or coated, particularly with a polymeric subbing or priming agent. Preferred polymeric materials for the support include polymers having good heat stability, such as polyesters. Particularly preferred polyesters are polyethylene terephthalate and polyethylene naphthalate.

Where the photothermographic or thermographic element is to be used as a photomask, the support should be transparent or highly transmissive of the radiation (i.e., ultraviolet or short wavelength visible radiation) which is used in the final imaging process.

A support with a backside resistive heating layer can also be used in photothermographic imaging systems such as shown in U.S. Pat. No. 4,374,921.

Use as a Photomask

As noted above, the possibility of low absorbance of the photothermographic and thermographic element in the range of 350–450 nm in non-imaged areas facilitates the use of the photothermographic and thermographic elements of the present invention in a process where there is a subsequent exposure of an ultraviolet or short wavelength visible radiation sensitive imageable medium. For example, imaging the photothermographic or thermographic element and subsequent development affords a visible image. The developed photothermographic or thermographic element absorbs ultraviolet or short wavelength visible radiation in the areas where there is a visible image and transmits ultraviolet or short wavelength visible radiation where there is no visible image. The developed element may then be used as a mask and placed between an ultraviolet or short wavelength visible radiation energy source and an ultraviolet or short wavelength visible radiation photosensitive imageable medium such as, for example, a photopolymer, diazo material, or photoresist. This process is particularly useful where the imageable medium comprises a priming plate and the photothermographic or thermographic element serves as an imagesetting film.

Objects and advantages of this invention will now be illustrated by the following examples, but the particular materials and amounts thereof recited in these examples, as well as other conditions and details, should not be construed to unduly limit this invention.

EXAMPLES

All materials used in the following examples are readily available from standard commercial sources, such as Aldrich Chemical Co. Milwaukee, Wis., unless otherwise specified. All percentages are by weight unless otherwise indicated. The following additional terms and materials were used.

Acryloid™ A-21 is an acrylic copolymer available from Rohm and Haas, Philadelphia, Pa.

Butvar™ B-79 is a polyvinyl butyral resin available from Monsanto Company, St. Louis, Mo.

CAB 171-15S is a cellulose acetate butyrate resin available from Eastman Kodak Co.

CBBA is 2-(4-chlorobenzoyl)benzoic acid.

Vinyl Sulfone-1 (VS-1) is described in European Laid Open Patent Application No. 0 600 589 A2 and has the following structure.

$$H_2C{=}CH{-}SO_2{-}CH_2{-}\underset{\underset{OH}{|}}{CH}{-}CH_2{-}SO_2{-}CH{=}CH_2$$

Antihalation Dye-1(AH-1) has the following structure. The preparation of this compound is described in Example 1f of U.S. Pat. No. 5,380,635.

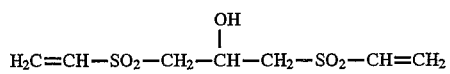
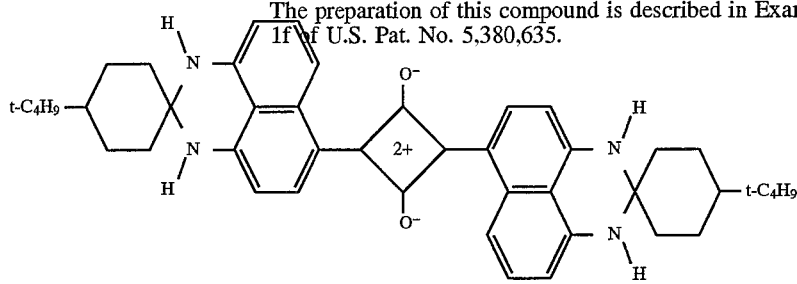

Desmodur™ N3300 is an aliphatic hexamethylene diisocyanate available from Bayer Chemicals, Pittsburgh, Pa.

MEK is methyl ethyl ketone (2-butanone).

MeOH is methanol.

MMBI is 2-mercapto-5-methylbenzimidazole.

4-MPA is 4-methylphthalic acid. Permanax™ WSO is 1,1-bis(2-hydroxy-3,5-dimethylphenyl)-3,5,5-trimethylhexane[CAS RN=7292-14-0] and is available from St-Jean PhotoChemicals, Inc. Quebec. It is a reducing agent (i.e., a hindered phenol developer) for the non-photosensitive reducible source of silver. It is also known as Nonox™.

PET is polyethylene terephthalate.

PHP is pyridinium hydrobromide perbromide.

PHZ is phthalazine.

TCPA is tetrachlorophthalic acid.

Sensitizing Dye-1 is described in U.S. patent application Ser. No. 425,860 (filed Apr. 20, 1995) and has the structure shown below.

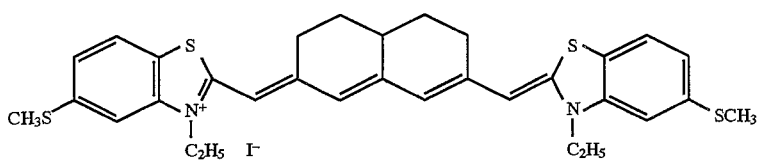

Antifoggant A is 2-(tribromomethylsulfonyl)quinoline. Its preparation is disclosed in U.S. Pat. No. 5,460,938. It has the structure shown below.

Samples were coated out under infrared safelights using a dual-knife coater. The photothermographic emulsion and topcoat formulations were coated onto a 7 mil (177.8 μm) blue tinted polyethylene terephthalate support provided with an antihalation back coating containing AH-1 in CAB 171-15S resin. After raising the hinged knives, the support was placed in position on the coater bed. The knives were then lowered and locked into place. The height of the knives was adjusted with wedges controlled by screw knobs and measured with electronic gauges. Knife #1 was raised to a clearance corresponding to the desired thickness of the support plus the wet thickness of layer #1. Knife #2 was raised to a height equal to the desired thickness of the support plus the wet thickness of layer #1 plus the wet thickness of layer #2.

Aliquots of solutions #1 and #2 were simultaneously poured onto the support in front of the corresponding knives. The support was immediately drawn past the knives and into an oven to produce a double layered coating. The coated photothermographic or thermographic element was then dried by taping the support to a belt which was rotated inside a BlueM™ oven.

The following examples provide exemplary synthetic procedures and preparatory procedures using the compounds of the invention.

Ethyl 3-chloro-2-cyanoacrylate was prepared as described in *Chem Ber.* 1970, 103, 1982–1991.

Preparation of Ethyl 3-(1-benzotriazole)-2-cyanoacrylic acid (HET-01):

A solution of ethyl 3-chloro-2-cyanoacrylate (1.0 g, 0.006 mol) and benzotriazole (0.75 g, 0.006 mol) in 30 mL of toluene was heated at reflux for 2 hours. The solution was cooled in an ice bath, and the resulting solid was collected. The solid was washed with toluene and dried to afford 1.00 g of the desired product.

Preparation of Ethyl 3-(1-imidazole)-2-cyanoacrylic acid (HET-02):

A solution of ethyl 3-chloro-2-cyanoacrylate (0.5 g, 0.003 mol) and imidazole (0.21 g, 0.003 mol) in 20 mL of toluene was heated at reflux for 2 hours. The solution was cooled in an ice bath, and the resulting solid was collected. The solid was washed with toluene and dried to afford 0.45 g of the desired product.

Emulsion Preparation

The following examples demonstrate the use of 3-heteroaromatic substituted acrylonitrile compounds in combination with hindered phenol developers.

The preparation of a pre-formed silver iodobromide emulsion, silver soap dispersion, homogenate, and halidized homogenate solutions used in the Examples is described below.

Formulation A—The following formulation was prepared. 3-heteroaromatic substituted acrylonitrile co-developers were incorporated in the topcoat layer.

A pre-formed iridium-doped core-shell silver behenate soap was prepared as described in U.S. Pat. No. 5,434,043 incorporated herein by reference.

The pre-formed soap contained 2.0% by weight of a 0.05 µm diameter iridiumdoped core-shell silver iodobromide emulsion (25% core containing 8% iodide, 92% bromide; and 75% all-bromide shell containing $1 \times 10^{-5}$ mole of iridium). A dispersion of this silver behenate soap was homogenized to 26.1% solids in 2-butanone containing 1.00% Butvar™ B-79 polyvinyl butyral resin.

To 172.0 g of this silver soap dispersion, was added 27 g of 2-butanone, and 2.10 mL of a solution of 0.23 g of pyridinium hydrobromide perbromide in 1.88 g of methanol. After 1 hour of mixing 1.50 mL of a solution of 0.170 g of calcium bromide in 1.35 g methanol was added. After 30 minutes the following infrared sensitizing dye premix was added.

| Material | Amount |
| --- | --- |
| CBBA | 1.520 g |
| Sensitizing Dye-1 | 0.006 g |
| MNBI | 0.140 g |
| Methanol | 4.800 g |

After 1.5 hours of mixing, 45.8 g of Butvar™ B-79 polyvinyl butyral was added. Stirring for 30 minutes was followed by addition of 1.23 g of 2-(tribromomethylsulfonyl)quinoline and 10.06 g of 1,1-bis (2-hydroxy-3,5-dimethylphenyl)-3,5,5-trimethylhexane (Permanax™). After 15 minutes 5.28 g of a solution of 0.580 g of Desmodur™ N3300 in 4.7 g of 2-butanone was added. After 15 minutes, 0.470 g of 4-methylphthalic acid and 0.350 g of tetrachlorophthalic acid were added followed by 1.05 g of phthalazine.

A topcoat solution was prepared in the following manner; 4.52 g of Acryloid-21™ polymethyl methacrylate and 115 g of CAB 171-15S cellulose acetate butyrate were mixed in 1.236 Kg of 2-butanone until dissolved. To 100 g of this premix were then added 0.090 g of benzotriazole, 0.25 g of Vinyl Sulfone-1 (VS-1), and the amount of 3-heteroaromatic substituted acrylonitrile described in the Examples below.

Sensitometry: The coated and dried photothermographic elements prepared from Formulation A were cut into 1.5 inch×11 inch strips (3.8 cm×27.9 cm) and exposed with a laser sensitometer incorporating a 811 nm laser diode sensitometer for 6 seconds. The coatings were processed on a roll processor for the amount of time indicated in the Examples below.

Sensitometry measurements were made on a custom built computer scanned densitometer using a filter appropriate to the sensitivity of the photothermographic element and are believed to be comparable to measurements from commercially available densitometers.

Dmin is the density of the non-exposed areas after development. It is the average of eight lowest density values on the exposed side of the fiducial mark.

Dmax is the highest density value on the exposed side of the fiducial mark.

Speed-2 is Log 1/E+4 corresponding to the density value of 1.00 above Dmin where E is the exposure in ergs/cm$^2$.

Speed-3 is Log 1/E+4 corresponding to the density value of 2.90 above Dmin where E is the exposure in ergs/cm$^2$.

Contrast-1 is the absolute value of the slope of the line joining the density points of 0.60 and 2.00 above Dmin.

Contrast-2 is the absolute value of the slope of the line joining the density points of 1.00 and 2.40 above Dmin.

Contrast-3 is the absolute value of the slope of the line joining the density points of 2.40 and 2.90 above Dmin.

3-Heteroaromatic substituted acrylonitrile compounds were studied with a hindered phenol developer system using Permanax™ as the hindered phenol developer. 3-Heteroaromatic substituted acrylonitrile compounds studied were HET-01, and HET-02. The structures of these compounds are shown above.

Example 1

To 20 g of the topcoat solution prepared as described above, were added one of the following:

$1.65 \times 10^{-4}$ moles HET-01

$1.05 \times 10^{-4}$ moles HET-02 (−)

$2.10 \times 10^{-4}$ moles HET-02 (+)

A sample containing only Permanax™ developer served as a control.

The photothermographic emulsion layer and topcoat layer were dual knife coated onto a 7 mil (178 µm) polyester support containing AH-1 in an antihalation backcoat. The first knife gap for the photothermographic emulsion layer was set to 2.5 mil (65 µm) above the support and the second knife gap for the topcoat layer was set at 3.5 mil (89 µm) above the support. Samples were dried for 4 minutes at 180° F. (82.2° C.) in a BlueM™ oven.

The sensitometric results, shown below, demonstrate that addition of a 3-heteroaromatic substituted acrylonitrile compound increases the contrast, speed, and Dmax of a photothermographic emulsion containing a hindered phenol developer. It is also noteworthy that Dmax was increased while Dmin was suppressed. The sensitometric response is similar to that observed for high contrast hybrid wet silver halide emulsions.

| Ex. | Developer | Processing Conditions | Dmin | Dmax |
|---|---|---|---|---|
| 1-1 | Permanax ™ | 10 seconds/255° F. | 0.151 | 2.951 |
| 1-2 | Permanax ™ + HET-01 | 10 seconds/255° F. | 0.144 | 4.27 |
| 1-3 | Permanax ™ + HET-02(−) | 10 seconds/255° F. | 0.147 | 2.929 |
| 1-4 | Permanax ™ + HET-02(+) | 10 seconds/255° F. | 0.147 | 3.483 |
| 1-5 | Permanax ™ | 15 seconds/255° F. | 0.170 | 3.00 |
| 1-6 | Permanax ™ + HET-01 | 15 seconds/255° F. | 0.155 | 4.68 |
| 1-7 | Permanax ™ + HET-02(−) | 15 seconds/255° F. | 0.158 | 3.101 |
| 1-8 | Permanax ™ + HET-02(+) | 15 seconds/255° F. | 0.164 | 3.81 |
| 1-9 | Permanax ™ + HET-01 | 20 seconds/255° F. | 0.151 | 4.668 |

| Ex. | Speed-2 | Speed-3 | Contrast-1 | Contrast-2 |
|---|---|---|---|---|
| 1-1 | 1.781 | * | 3.409 | 3.103 |
| 1-2 | 1.88 | 1.777 | 17.789 | 19.071 |
| 1-3 | 1.788 | * | 8.536 | 8.708 |
| 1-4 | 1.92 | 1.791 | 14.69 | 16.545 |
| 1-5 | 1.961 | * | 3.301 | 2.427 |
| 1-6 | 2.206 | 2.144 | 25.079 | 29.9 |
| 1-7 | 1.788 | 1.486 | 14.311 | 15.713 |
| 1-8 | 1.92 | 2.093 | 23.111 | 28.754 |
| 1-9 | 2.275 | 2.224 | 27.388 | 35.16 |

*Speed-3 could not be measured for these sample.

Reasonable modifications and variations are possible from the foregoing disclosure without departing from either the spirit or scope of the present invention as defined by the claims.

What is claimed is:

1. A black-and-white photothermographic element comprising a support bearing at least one photosensitive, image-forming, photothermographic emulsion layer comprising:

(a) a photosensitive silver halide;
   (b) a non-photosensitive, reducible silver source;
   (c) a reducing agent system for silver ion; and
   (d) a binder.

wherein the reducing agent system comprises:
   (i) at least one hindered phenol; and
   (ii) at least one compound of the formula

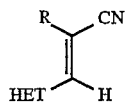

wherein:
   R represents an aryl group or an electron withdrawing group; and
   HET represents a 5- or 6-membered heteroaromatic ring group attached through a non-quaternary ring nitrogen atom of said 5- or 6-membered ring, the heteroaromatic ring being composed of only carbon and nitrogen atoms, with up to 4 nitrogen atoms.

2. The photothermographic element according to claim 1 wherein R is an electron withdrawing aryl group.

3. The photothermographic element according to claim 1 wherein R is an electron withdrawing group having a Hammett $\sigma_p$ value greater than 0.20.

4. The photothermographic element according to claim 1 wherein R is selected from the group consisting of cyano, halogen, formyl, alkoxycarbonyl, hydroxycarbonyl, metaloxycarbonyl, nitro, acetyl, perfluoroalkyl, alkylsulfonyl, and arylsulfonyl.

5. The photothermographic element according to claim 1 wherein said non-photosensitive, reducible source of silver is a silver salt of a carboxylic acid having from 10 to 30 carbon atoms.

6. The photothermographic element according to claim 1 wherein HET represents a pyrrole, diazole, triazole or tetrazole ring group.

7. The photothermographic element according to claim 1 wherein HET represents a diazole or triazole ring group.

8. The photothermographic element according to claim 1 wherein said binder is hydrophobic.

9. The photothermographic element according to claim 1 wherein said hindered phenol is selected from the group consisting of binaphthols, biphenols, bis(hydroxynaphthyl) methanes, bis(hydroxyphenyl)methanes, and naphthols.

10. The photothermographic element according to claim 9 wherein said hindered phenol is a bis(hydroxyphenyl) methane.

11. A process comprising the steps of:

(a) exposing the photothermographic element of claim 1 on a support transparent to ultraviolet radiation or short wavelength visible radiation, to electromagnetic radiation to which the photosensitive silver halide of the element is sensitive to generate a latent image; and thereafter heating said element to form a visible image thereon;

(b) positioning said element with a visible image thereon between a source of ultraviolet or short wavelength visible radiation and an ultraviolet or short wavelength visible radiation photosensitive imageable medium; and (c) then exposing said ultraviolet or short wavelength visible radiation sensitive imageable medium to ultraviolet or short wavelength visible radiation through said visible image on said element, thereby absorbing ultraviolet or short wavelength visible radiation in the areas of said element where there is a visible image and transmitting ultraviolet or short wavelength visible radiation where there is no visible image on said element.

12. The process of claim 11 wherein said imageable medium is a resist developable, ultraviolet or short wavelength visible radiation sensitive imageable medium.

13. The process of claim 11 wherein said ultraviolet or short wavelength visible radiation sensitive imageable medium is a printing plate, a contact proof, or a duplicating film.

14. A black-and-white thermographic element comprising a support bearing at least one, image-forming, thermographic emulsion layer comprising:

(a) a non-photosensitive, reducible silver source;

(b) a reducing agent system for silver ion; and (c) a binder;

wherein said reducing agent system comprises:

(i) at least one hindered phenol; and (ii) at least one co-developer of the formula

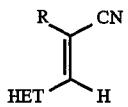

wherein:

R represents an aryl group or an electron withdrawing group; and

HET represents a 5- or 6-membered heteroaromatic ring group attached through a non-quaternary ring nitrogen atom of said ring group, the heteroaromatic ring being composed of only carbon and nitrogen atoms with up to 4 nitrogen atoms.

15. The thermographic element according to claim 14 wherein R is an electron withdrawing aryl group.

16. The thermographic element according to claim 15 wherein R is an electron withdrawing group having a Hammett $\sigma_P$ value greater than 0.20.

17. The thermographic element according to claim 14 wherein R is selected from the group consisting of cyano, halogen, formyl, alkoxycarbonyl, hydroxycarbonyl, metaloxycarbonyl, nitro, acetyl, perfluoroalkyl, alkylsulfonyl, and arylsulfonyl.

18. The thermographic element according to claim 14 wherein said non-photosensitive, reducible source of silver is a silver salt of a carboxylic acid having from 10 to 30 carbon atoms.

19. The thermographic element according to claim 14 wherein HET represents a pyrrole, diazole, triazole or tetrazole ring group.

20. The thermographic element according to claim 14 wherein HET represents a diazole or triazole ring group.

21. A process comprising the steps of:

(a) heating the thermographic element of claim 14 on a support transparent to ultraviolet radiation or short wavelength visible radiation, to form a visible image thereon;

(b) positioning said element with a visible image thereon between a source of ultraviolet or short wavelength visible radiation and an ultraviolet or short wavelength visible radiation photosensitive imageable medium; and (c) then exposing said ultraviolet or short wavelength visible radiation sensitive imageable medium to ultraviolet or short wavelength visible radiation through said visible image on said element, thereby absorbing ultraviolet or short wavelength visible radiation in the areas of said element where there is a visible image and transmitting ultraviolet or short wavelength visible radiation where there is no visible image on said element.

22. The photothermographic element according to claim 1 wherein HET represents an imidazole or a benzotriazole ring group.

* * * * *